United States Patent [19]

Monico

[11] Patent Number: 5,006,961
[45] Date of Patent: Apr. 9, 1991

[54] SEGMENTED BACKPLANE FOR MULTIPLE MICROPROCESSING MODULES

[75] Inventor: Juan A. Monico, San Jose, Calif.

[73] Assignee: Catene Systems Corporation, San Jose, Calif.

[21] Appl. No.: 420,746

[22] Filed: Oct. 12, 1989

Related U.S. Application Data

[63] Continuation of Ser. No. 185,709, Apr. 25, 1988, abandoned.

[51] Int. Cl.⁵ .............................................. H05K 1/04
[52] U.S. Cl. .................................... 361/413; 361/407; 439/61
[58] Field of Search .............. 361/407, 412, 413, 414, 361/400, 405, 415; 439/60, 61, 65, 74

[56] References Cited

U.S. PATENT DOCUMENTS

| | | | |
|---|---|---|---|
| 3,008,245 | 11/1961 | Meuche | 439/61 X |
| 3,448,345 | 6/1969 | Koehler et al. | 361/407 X |
| 3,742,309 | 6/1973 | Sterner | 361/413 |
| 4,250,536 | 2/1981 | Barringer | 361/413 |
| 4,307,438 | 12/1981 | Grubb | 361/413 |
| 4,401,351 | 8/1983 | Record | 439/61 |
| 4,511,950 | 4/1985 | Bunner et al. | 361/413 |
| 4,585,285 | 4/1986 | Martens | 361/407 X |
| 4,647,123 | 3/1987 | Chin et al. | 439/61 |
| 4,683,550 | 7/1987 | Jindrick | 361/413 X |
| 4,697,858 | 10/1987 | Balakrishnan | 361/413 |

FOREIGN PATENT DOCUMENTS 1232623  1/1967  Fed. Rep. of Germany ...... 361/413

*Primary Examiner*—Gerald P. Tolin
*Attorney, Agent, or Firm*—Roger S. Borovoy

[57] ABSTRACT

The invention relates to a novel type of segmented backplane for multiple microprocessor module boards. The modules are connected to a plurality of backplane segments. Each backplane segment includes connectors for attachment of the microprocessing modules, and a bus segment. When the backplane segments are connected together, the bus segments form a continuous bus. The microprocessing modules carry out their intra-module communication entirely within their own backplane segment without communication through the bus. However, all inter-module communication is carried out through the bus.

3 Claims, 3 Drawing Sheets

SEGMENTED BACKPLANE FOR MULTIPLE MICROPROCESSING MODULES

This application is a continuation of application Ser. No. 07/185,709 filed Apr. 25, 1988, now abandoned and assigned to the same assignee as the subject invention.

BACKGROUND OF THE INVENTION

Many bus schemes have been developed to enable multiple microprecessors to communicate with each other with and also with shared memory and peripherals. Typically, these processors communicate over a single bus. Various popular bus architectures have reached some level of industry popularity, including the Multibus and VMe-bus. The multiple processors, as well as a variety of peripherals, shared memory and transmission nodes for local area networks are all connected to the same bus.

What that means, however, is that only one processor can communicate with shared memory or peripherals on any given bus cycle. When a processor asks for permission to transmit onto the bus, first it must wait intil the bus is free, and after that, while it is using the bus, all other processors must wait their turns. Obviously such a prior art system requires a "traffic cop", known as a bus arbitrator, to be sure that only one processor at a time uses the bus. Otherwise, total confusion would reign. In other words, if a first processor is talking to shared memory, no other processor may talk either to shared memory or to other peripherals or to another processor while the bus is being used by the first processor. Obviously, therefore, as is well known, the bus creates a bottleneck in the overall data processing speed of a multi-processor system.

BRIEF DESCRIPTION OF THE INVENTION

Contrary to bus architectures of the prior art, the segmented backplane for multi-microprocessing modules of this invention uses a unique, two-bus architecture. Each processor has its own module and its own private bus communication structure for communicating with memory, local area networks, or peripherals connected on the common backplane segment with the processor. None of this communication needs to go through the inter-processor communication bus, as will be explained. The only time a processor needs to use the common, segmented bus is to communicate with other processors on different modules. Obviously, since most of the communication with memory and peripherals is within the same backplane segment, not requiring the inter-module communication bus, this frees up the inter-module bus to permit more rapid inter-processor communication.

Briefly, the segmented backplane for multiple microprocessing modules of the invention uses a segmented bus structure to connect the multiple microprocessing modules. Each module has a bus segment capable of being joined to other segments of other modules to form a continuous bus. The modules are termed "backplane segments" because together, they form a continuous backplane having a common bus.

Each backplane segment includes connectors for connecting microprocessing modules to the segment. These connectors are different from the bus connectors which are adapted to connect the bus segments on the backplane segments together to form the inter-module bus of the segmented backplane.

The unique aspect of the invention is that each of the microprocessing modules can carry out their intra-module communication entirely within their own backplane segment without communicating through the inter-module bus. Only the intermodule communication, i.e., communication between different Processors on different bus segments, is carried out through the bus comprising the connected bus segments. This greatly speeds up inter-processor communication.

Preferably the connectors on each backplane segment are standard personal computer connectors, for example, those used in the IBM personal computer and compatibles. Other standard bus configurations may be used for some or all of the segments. The provision of standard connectors makes it possible to use standard personal computer cards for each processor, including memory cards, local area network (LAN) cards, hard disk cards, graphics adaptor cards, and special peripheral communication cards, such as those used to communicate with printers or CD ROMS.

BRIEF DESCRIPTION OF THE DRAWINGS

The operation of the segmented backplane for multiple microprocessing modules of the invention will be better understood from the more detailed description which follows, making reference to the drawings in which.

DESCRIPTION OF THE PREFERRED EMBODIMENT

Figure 1:
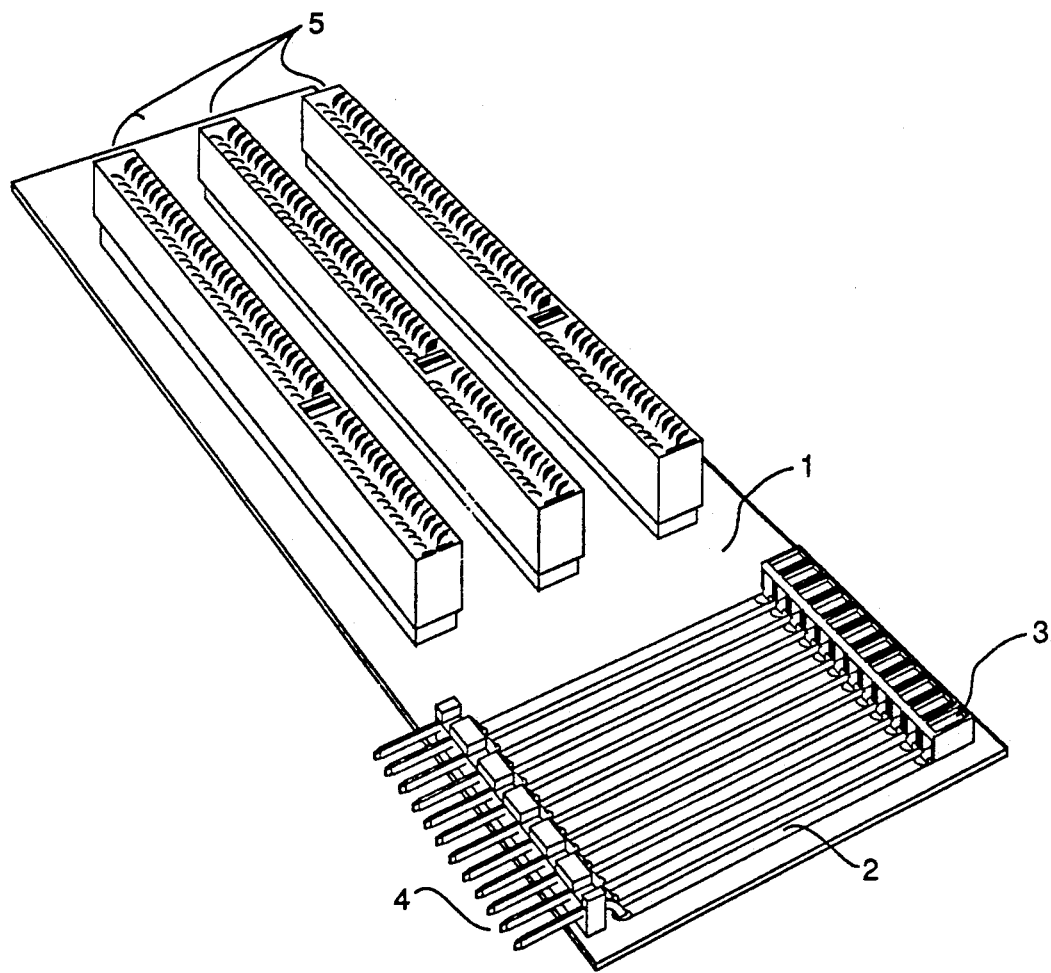
FIG. 1 is a perspective view of a single backplane segment of the invention.

Referring to FIG. 1, a backplane segment 1 for a microprocessing module is shown. The backplane segment 1 includes a bus segment 2 having a female connector 3 and a male connector 4. Obviously, many different forms of connectors may be used without departing from the scope of the invention. The illustrated backplane segment shows 12 pins, one for each line of the bus. However, the number of bus lines employed is totally up to the user depending upon the particular bus architecture desired. Segmented bus 2 is used only for communication between processors, thus possibly requiring fewer bus lines than might be required had the bus been used for other types of communication, such as between processors and peripherals.

The backplane segment shown in FIG. 1 has multiple connectors 5 (three in the illustration). The number of these connectors may vary depending upon how many processor or peripheral cards are desired to be included in a single processor unit on a single backplane segment.

In the preferred embodiment of the invention, connectors 5 are standard PC connectors like those used in the IBM PCs and compatibles. The advantage of using these standard connectors is that many standard, commercially available processor and peripheral boards can be inserted, including memory, LAN, graphics adaptors, hard disk cards and the like. In each backplane segment 1 of the invention, one of the cards to be inserted into one of the connectors 5 is a microprocessing module. The other connectors are used for memory, peripherals and the like.

On the underside and within the layers of backplane segment 1, which is a standard printed circuit board, are the intra-module communication lines, as is well known in the art. This intra-module wiring can be designed by the skilled practitioner exactly as conventionally done for most computers to enable a processor to communicate with its associated peripherals. Unique to this invention, all of the intra-module communication is carried out through the wiring on the single backplane segment; none of that communication makes use of the bus segment 2.

Bus segment 2 is used exclusively for communication between multiple microprocessing modules. One microprocessor communicates with another through the bus segment 2. The necessary connections between a microprocessing module to be inserted in one of connectors 5 and bus segment 2 are contained within the printed wiring within segment 1. Typically the peripherals connected to the same microprocessing module segment as the microprocessor do not communicate through bus segment 2.

Figure 2:
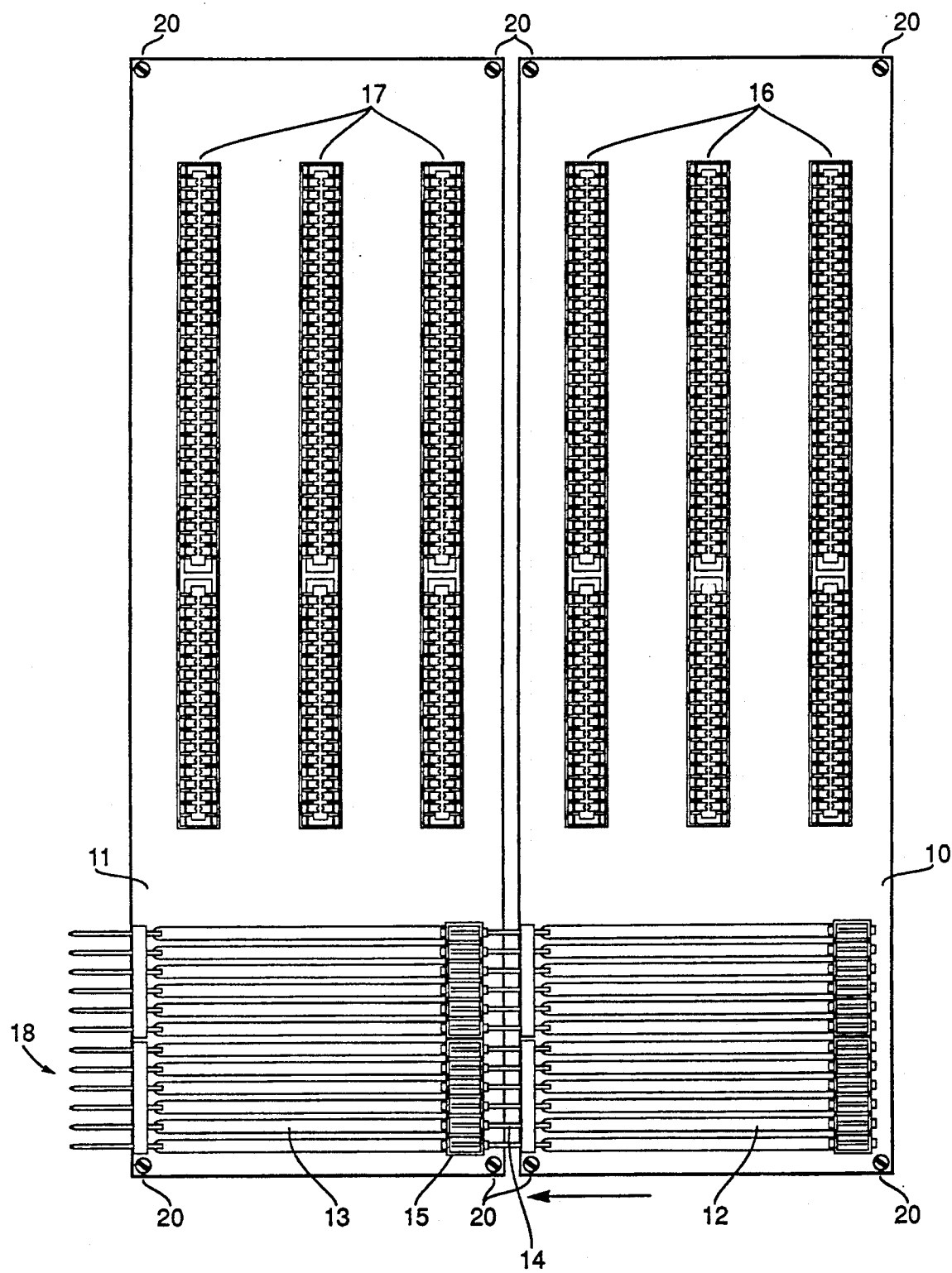
FIG. 2 is a plan view of two backplane segments connected together, showing the connection between the bus segments
Figure 3:
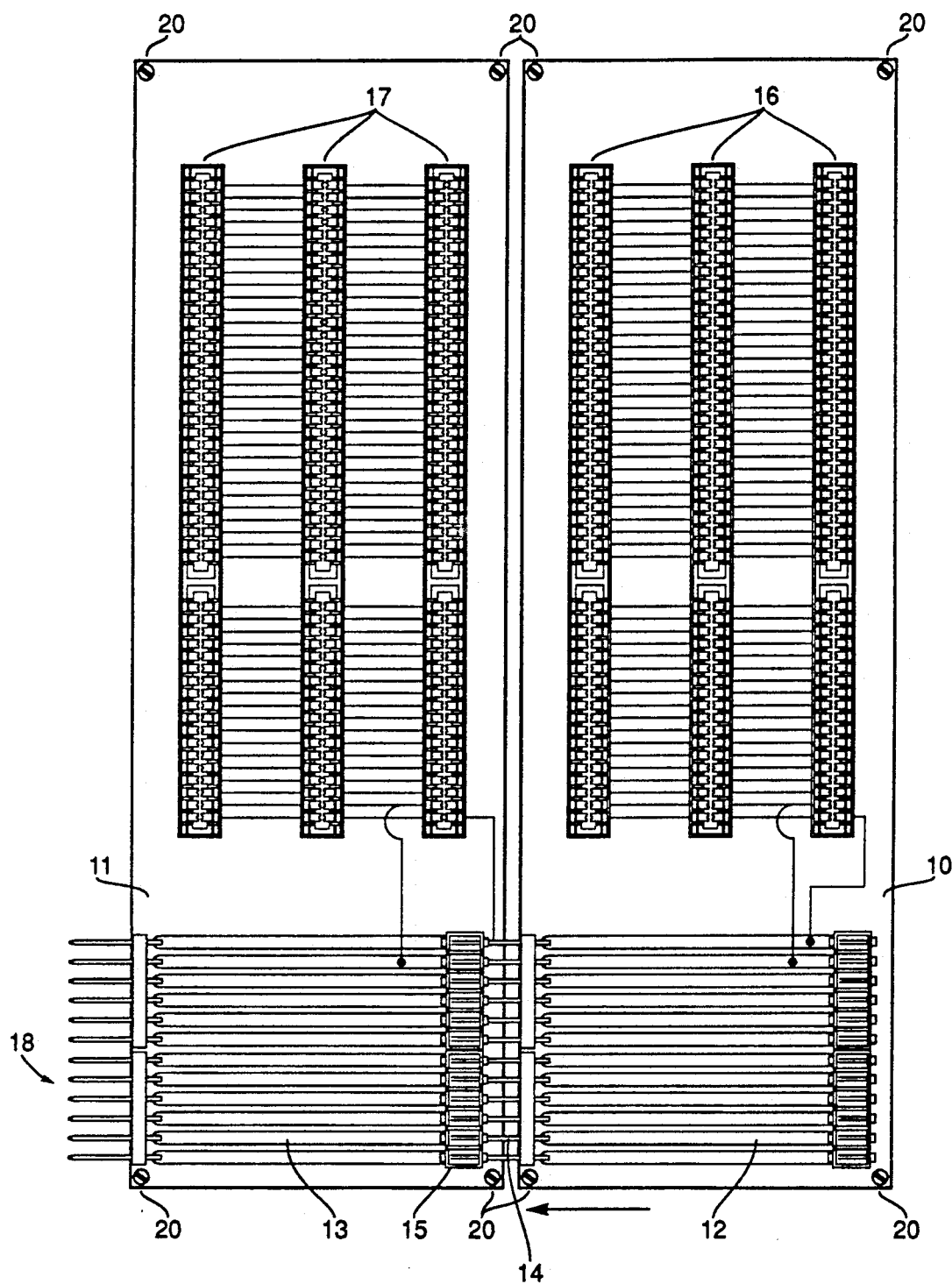
FIG. 3 illustrates the standard personal computer interconnections between card slots and power buses, as is well known in the art.

Referring to FIG. 2, two backplane segments 10 and 11 are connected together. The essential connection is between bus segment 12 of backplane segment 10 and bus segment 13 of backplane segment 11 This connection is accomplished by inserting the set of pins 14 on module 10 into connector 15 on module 11. Obviously many more backplane segments can be connected in the same manner to form a multiple microprocessor, normally called a "multiprocessor", to achieve much more rapid computation than can be achieved with a single microprocessor.

Although multiprocessors are well known, never before has it been possible to construct them as an Erector set in the manner described in this invention. In actual practice, each of the backplane segments 10 and 11, along with additional segments, are anchored to a frame structure (not shown) using screws 20, which completes the fabrication of the multiprocessor. The structure includes the necessary power supplies. The advantage of the segmented multiprocessor of the invention is that it can be expanded after purchase merely by inserting additional processing module segments as needed. Multiprocessors have the advantage of having each processor attack a part of the computational problem at the same time as another processor is attacking a different part of the problem. By segmenting the problem and solving it in a "parallel processing" mode, much faster results can be achieved. In the past 3-4 years, multiprocessors have become very popular for solving problems which would otherwise take too long to be economically solved by a single processor.

As described earlier in connection with FIG. 1, connectors 16 are for connecting the processor board and peripherals boards to backplane segment 10; connectors 17 are for connecting the processor and peripheral boards to backplane segment 11. The processor and peripheral boards connected to connectors 16 carry out their intra-module communication through the wiring contained within backplane segment 10. Similarly the processor and peripherals connected through connectors 17 carry out their intra-module communication through the wiring within backplane segment 11. Inter-module communication between segments 10 and 11 is carried out through the inter-module bus 18 comprised of bus segments 12 and 13.

As discussed earlier, the inter-module bus comprised of segments 12 and 13 is free for inter-processor communication and is not cluttered with communication between a single processor and its peripherals, since such communication is carried out within a single module 10 or 11 without need for access to the external bus 18.

While the invention has been described in connection with its preferred embodiment shown in FIGS. 1 and 2, those skilled in the art will be capable of making many modifications to these preferred embodiments without departing from the spirit and scope of the invention, as set forth in the claims which follow.

I claim:

1. A segmented computer backplane adapted to have one or more printed circuit cards connected to it, said backplane forming a single unitary bus and backplane structure made up of a plurality of physically separable but interconnected backplane segments, each backplane segment comprising: a plurality of connecting means for respectively connecting a plurality of said cards to said backplane segment; a plurality of fixed electrical interconnections for making connections to and between said plurality of connecting means, said connections being completely established within said backplane segment irrespective of whether said cards are actually inserted into said connecting means; a bus segment which is removably connected with other bs segments of other backplane segments to form a unitary bus; and a bus segment connector adapted to connect said bus segment of said backplane segment to the bus segment of another backplane segment to form a unitary bus and backplane, said plurality of connected cards carrying out electrical communication among themselves entirely through the said plurality of fixed electrical interconnections of their own backplane segment without communication through said bus, whereby said connected backplane segments form a unitary backplane having its inter-segment communication carried out through said single unitary bus.

2. The segmented backplane of claim 1 wherein one of said printed circuit cards is a personal computer.

3. The segmented backplane of claim 2 wherein another of said printed circuit cards is a personal computer peripheral card.

* * * * *

UNITED STATES PATENT AND TRADEMARK OFFICE
CERTIFICATE OF CORRECTION

PATENT NO. : 5,006,961
DATED : April 9, 1991
INVENTOR(S) : Juan A. Monico

It is certified that error appears in the above-indentified patent and that said Letters Patent is hereby corrected as shown below:

Column 4, Line 37;    Delete "bs";    Insert in place thereof --bus--

Signed and Sealed this

Sixteenth Day of January, 1996

Attest:

BRUCE LEHMAN

Attesting Officer    Commissioner of Patents and Trademarks